United States Patent
Furse et al.

(10) Patent No.: US 6,937,944 B2
(45) Date of Patent: Aug. 30, 2005

(54) FREQUENCY DOMAIN REFLECTOMETRY SYSTEM FOR BASELINING AND MAPPING OF WIRES AND CABLES

(76) Inventors: Cynthia M. Furse, 9400 Emigration Canyon, Salt Lake City, UT (US) 84108; Kenneth G. Blemel, 12412 Sierra Grande Ave. NE., Albuquerque, NM (US) 87112

( * ) Notice: Subject to any disclaimer, the term of this patent is extended or adjusted under 35 U.S.C. 154(b) by 0 days.

(21) Appl. No.: 10/190,311

(22) Filed: Jul. 5, 2002

(65) Prior Publication Data

US 2004/0073395 A1 Apr. 15, 2004

(Under 37 CFR 1.47)

Related U.S. Application Data

(63) Continuation-in-part of application No. 10/043,884, filed on Jan. 9, 2002.
(60) Provisional application No. 60/303,676, filed on Jul. 7, 2001.

(51) Int. Cl.[7] .............................................. G01R 31/08
(52) U.S. Cl. ........................................ 702/58; 324/534
(58) Field of Search ........................ 702/57–59, 65–66, 702/71, 75–77, 108, 117, 124, 183–185, 189–190; 324/533–534, 539, 541, 543–544; 439/912

(56) References Cited

U.S. PATENT DOCUMENTS

| | | | | | |
|---|---|---|---|---|---|
| 5,083,086 | A | * | 1/1992 | Steiner | 324/533 |
| 5,128,619 | A | * | 7/1992 | Bjork et al. | 324/533 |
| 5,790,977 | A | * | 8/1998 | Ezekiel | 702/122 |
| 5,994,905 | A | * | 11/1999 | Franchville | 324/533 |
| 6,011,399 | A | * | 1/2000 | Matsumaru et al. | 324/538 |
| 6,016,464 | A | * | 1/2000 | Richardson | 702/79 |
| 6,259,256 | B1 | * | 7/2001 | Walling | 324/539 |
| 6,266,802 | B1 | * | 7/2001 | Malm et al. | 716/12 |
| 2003/0125893 | A1 | * | 7/2003 | Furse | 702/108 |
| 2004/0015311 | A1 | * | 1/2004 | Furse et al. | 702/108 |

* cited by examiner

Primary Examiner—Marc S. Hoff
Assistant Examiner—Mary Catherine Baran
(74) Attorney, Agent, or Firm—Morriss O'Bryant Compagni

(57) ABSTRACT

A system that utilizes the principles of frequency domain reflectometry to perform baselining and mapping of single and mutliple wires and cables, the baselining to be used as a comparison when the wires are tested at a later date to determine if the wires or cables have been damaged, wherein a first waveform is generated from a baseline FDR measurement of a cable, a second waveform is generated from a new FDR measurement of the cable, and a comparison of the first and second waveforms is performed to determine if the integrity of the cable has changed, and wherein the mapping is performed in order to determine the present configuration of a network or tree of wires or cables.

32 Claims, 9 Drawing Sheets

FREQUENCY DOMAIN REFLECTOMETRY SYSTEM FOR BASELINING AND MAPPING OF WIRES AND CABLES

CROSS REFERENCE TO RELATED APPLICATIONS

This document claims priority to U.S. Provisional Patent Application Ser. No. 60/303,676, filed on Jul. 7, 2001, and to U.S. patent application Ser. No. 10/043,884, filed on Jan. 9, 2002.

BACKGROUND

1. The Field of the Invention

This invention relates generally to systems and techniques for performing baselining and mapping of wires and cables. More specifically, the invention teaches how to utilize the principles of frequency domain reflectometry to perform baselining and mapping of single and multiple wires and cables, the baselining to be used as a comparison when the wires are tested at a later date to determine if the wires or cables have been damaged, and the mapping to be performed in order to determine the present configuration of a single wire or cable, or a network or tree of wires or cables.

2. Background of the Invention

The benefits of being able to test wires and cables (hereinafter to be referred to as a cable) are many. Some reasons are obvious. For example, cables are used in many pieces of equipment that can have catastrophic results if the equipment fails. A good example of this is an airliner. However, the consequences of non-performance do not have to be so dire in order to see that benefits are still to be gained. For example, cables are used in many locations where they are difficult to reach, such as in the infrastructure of buildings and homes. Essentially, in many cases it is simply not practical to remove cable for testing, especially when this action can cause more damage than it prevents.

Given that the need for cable testing is important and in some cases imperative, the question is how to perform accurate testing that is practical, meaning relatively inexpensive and at a reasonable cost. The prior art describes various techniques for performing cable testing. One such technique is time domain reflectometry (TDR). TDR is performed by sending an electrical pulse down a cable, and then receiving a reflected pulse. By analyzing the reflected pulse, it is possible to determine cable length, the type of load on the cable, and the location of open or short circuits.

One of the main disadvantages of TDR is that the equipment required to perform time analysis of a reflected signal is expensive and often bulky. These factors of cost and size can be critically important. A less costly and bulky system can be used in more places, more often, and can result in great savings in money spent on performing maintenance functions, and by replacing equipment before failure. But more importantly, the greatest benefit may be the saving of lives.

Consider again the airline industry. Miles and miles of cabling inside an airplane is extremely difficult to reach and test. If the cabling is removed for testing, the cabling can be damaged where no damage existed before. Thus, testing can result in more harm than good when cabling must be moved to gain access. But the nature of an airplane simply makes access with bulky testing equipment difficult. In addition, if the electronics for testing cables could remain in situ, then testing could be automated and used routinely before or after flight, or at any other time that testing was requested. This can be accomplished at this time only with smaller, less expensive systems such as provided by frequency domain reflectometry.

It is noted that TDR is not the only prior art technique available for cable testing. In standing wave reflectometry (SWR), a signal is transmitted and a reflected signal is received at a directional coupler. The system then measures the magnitude of the reflected signal. A short circuit, an open circuit, and the depth of a null gives the same information as TDR. However, this technique is generally less accurate and nearly as expensive as TDR.

It is worth noting that the prior art sometimes refers to an FDR cable testing system. However, upon closer inspection, the system being described is actually an SWR system as described above.

The FDR system to be described in this document is cable of very specific determination of cable characteristics. These characteristics include length, impedance (which is characterized as an open or short circuit condition), the location of an open or short circuit, capacitance, inductance, and resistance. However, for diagnostic purposes, it would be advantageous to also use the FDR system for baselining. Baselining is defined here as taking FDR measurements of a cable that is known to be in working order. Accordingly, it would be an advantage over the prior art to utilize FDR baseline measurements in order to perform testing of cables because the FDR system is relatively smaller and therefore usable in more locations that are otherwise more difficult to reach with state of the art cable testing equipment. It would be another advantage to provide a system that would be less costly because of the nature of the components utilized therein. It would be another advantage to provide a system that is more likely to be used because it is not as difficult to use as the prior art cable testing equipment, and can be automated for regular testing even by unskilled personnel.

The technology being applied to the problem of cable testing by the present invention has not previously been used for this purpose. Specifically, frequency domain reflectometry (FDR) is typically used in radar applications. FDR is based on single frequency radar or stepped frequency radar. It was utilized in a free-space environment where antennas are used to transmit and receive a radar signal. Thus, the results produced when used for cable testing were surprising to those skilled in the art.

It would also be an advantage over the prior art to utilize an FDR system for mapping. Generally, the layout of existing cabling is known. For example, a building will have wiring diagrams to describe the location and path of wiring. However, records may be lost. Consider also the situation where cabling may be modified without the knowledge or authorization of those who control it. For example, an illegal connection might be made to a television cable. Accordingly, it would be advantageous to be able to use the FDR system to determine the physical or structural layout of a cable in order to determine where all connections are being made.

SUMMARY OF INVENTION

It is an object of the present invention to provide a system for cable testing that utilizes the principles of frequency domain reflectometry (FDR) to provide a baseline of cable characteristics.

It is another object to provide an FDR cable testing system that is less costly than prior art cable testing equipment.

It is another object to provide an FDR cable testing system for baselining that is less bulky than prior art cable testing equipment.

It is another object to provide an FDR cable testing system for baselining that utilizes less power than prior art cable testing equipment.

It is another object to provide an FDR cable testing system that can perform mapping of single cables, and trees or networks.

In a preferred embodiment, the present invention is a system that utilizes the principles of frequency domain reflectometry to perform baselining and mapping of single and mutliple wires and cables, the baselining to be used as a comparison when the wires are tested at a later date to determine if the wires or cables have been damaged, wherein a first waveform is generated from a baseline FDR measurement of a cable, a second waveform is generated from a new FDR measurement of the cable, and a comparison of the first and second waveforms is performed to determine if the integrity of the cable has changed, and wherein the mapping is performed in order to determine the present configuration of a network or tree of wires or cables.

In a first aspect of the invention, a frequency domain reflectometer is utilized to obtain a baseline measurement of cable characteristics, and the baseline measurement is then stored for comparison with future measurements.

In a second aspect of the invention, a set of sine waves is transmitted, and a reflected signal is combined with the transmitted signal and analyzed to determine cable characteristics that are stored as the baseline measurement.

In a third aspect of the invention, the electronic circuitry can be disposed within a single integrated circuit.

In a fourth aspect of the invention, the FDR cable testing system provides at least the same level of accuracy as the prior art cable testing systems.

In a fifth aspect of the invention, the FDR cable testing system is utilized to map the structure of multiple cables configured as a tree or network.

These and other objects, features, advantages and alternative aspects of the present invention will become apparent to those skilled in the art from a consideration of the following detailed description taken in combination with the accompanying drawings.

DETAILED DESCRIPTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

In the most basic principles of FDR, a set of sine waves is transmitted in a cable, and a reflected signal is then analyzed. One of the main advantages of FDR over TDR is that an FDR system only requires five distinct electronic components, and these components are relatively inexpensive. In contrast, a TDR system is approximately the size of a cigar box, and its components can cost approximately $1500. Thus, whereas the present invention can be disposed within a single integrated circuit, the TDR system is much larger. In addition, the cable testing system utilizing FDR requires much less power than the TDR system, and the cost is around $20 for the FDR system circuitry.

While FDR, TDR and SWR systems are known in the prior art, utilizing an FDR system to test cables is a novel application of the technology, and the results are unexpected.

Figure 1:
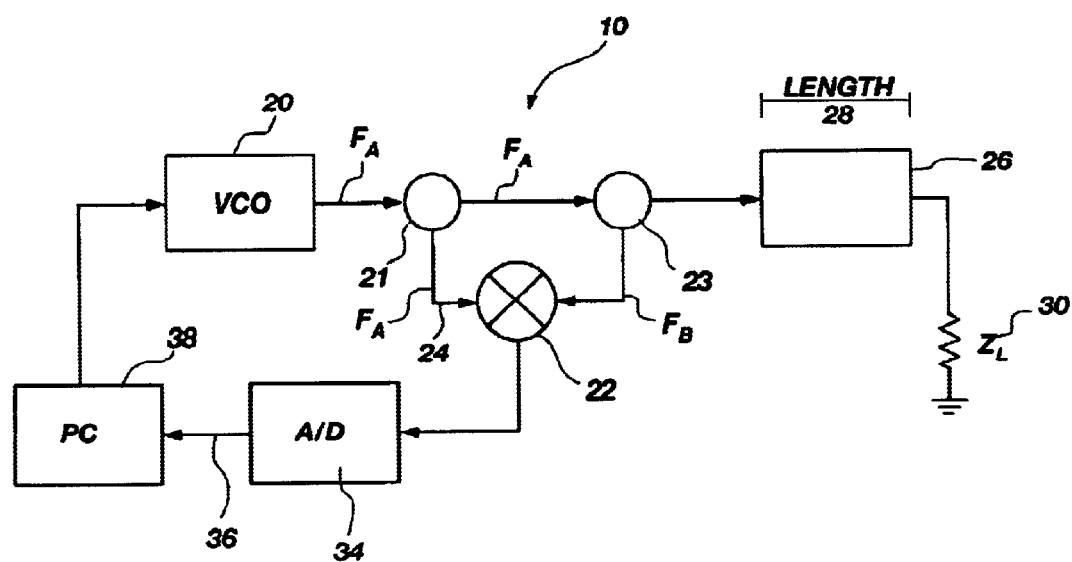
FIG. 1 is a schematic block diagram illustrating an embodiment of a frequency domain reflectometry (FDR) cable testing system that is made in accordance with the principles of the present invention.

The FDR cable testing system 10 of the present invention is shown in FIG. 1. A sine wave generator such as a voltage controlled oscillator (VCO) 20 generates an input signal $F_A$ in the form of sine waves. The VCO 20 feeds the input signal $F_A$ down two different paths. The first path of the input signal $F_A$ is into a directional coupler 21. From there, the input signal goes to a mixer 22 as a test or reference signal 24. The second path for the input signal $F_A$ is into a device under test or cable under test (CUT) 26. The CUT 26 will have some characteristic load $Z_L$ 30.

While the FDR cable testing system 10 was initially designed by the inventors to detect opens and shorts in a cable, the system can also detect inductive and capacitive impedances. Thus, the characteristics of the CUT 26 that are of most interest to the present invention's function as a cable testing system are of the length 28 and of the load 30. It should be recognized that the load 30 of the CUT 26 can be complex.

When the input signal $F_A$ is generated by the VCO 20, the input signal $F_A$ is reflect at the load 30, and is passed back along the CUT 26. The reflected signal $F_B$ is split from the CUT 26 using directional coupler 23 and is then received by the mixer 22. A combined output signal 32 is then read from the mixer 22 and sent to an analog to digital (A/D) converter 34. Because a mixer is a frequency multiplier, the combined output signal 32 of the mixer 22 has three components: the input signal $F_A$, along with $F_A+F_B$, and $F_A-F_B$. It should be apparent that the components $F_A$ and $F_A+F_B$ are going to be high frequency signals, but $F_A-F_B$ is not. Because $F_A=F_B$, it is a DC signal.

The A/D converter 34 thus automatically filters out the high frequency components $F_A$ and $F_A+F_B$ of the combined signal 32, leaving only the desired DC component $F_A-F_B$, which has a magnitude related to the electrical length of the CUT 26 and the load 30. The resulting signal 36 is then sent to a processor 38 such as a microcontroller or other processing system. The processor 38 must perform Fast Fourier Transform (FFT) calculations and some algebraic calculations to obtain the desired information. The function of the FFT calculations is to determine the number of cycles as a function of frequency in the digital signal generated by the A/D converter 34. The specific algebraic calculations will be shown in relation to an explanation of FIG. 2.

There are various methods that can be used to determine the number of cycles above. The FFT is a convenient system, and all of these methods are known to those skilled in the art. These methods include the Discrete Fourier Transform, the Two Equations—Two Unknowns method, N-Equations N-Unknowns, Interpolation and FFT, Interspersing Zero Points and Low Pass Filtering, Acceleration of Data Signal, Zero Crossing of Signals, and finally Mathematical Modeling.

Any of these methods can be substituted for FFT without changing the essence of the invention. These other methods are also known to those skilled in the art, and are not considered a limitation of the invention. The FFT method is simply offered in more detail in order to provide a working example.

The processor 38 generally serves another useful function other than performing the calculations that obtain the desired results. Specifically, it is desirable to use the processor 38 to control operation of the VCO 20. This is because the processor 38 can also be made capable of stepping the VCO 20 through various sets of frequencies in order to determine all of the desired characteristics of the CUT 26. In other words, several frequencies in several different frequency bands could be analyzed using this method.

The implications of the simple circuit used in the FDR cable testing system 10 as described in FIG. 1 should not be overlooked. The FDR cable testing system 10 is capable of providing data regarding loads thereon, including open circuits, short circuits, capacitance, inductance, resistance, some very large chafes, frays, and other anomalies. As implemented, the FDR cable testing system also provides the length of the CUT 26 within approximately 3 to 7 centimeters. However, it is envisioned this range can be controlled (reduced or increased) by varying the range and resolution of the frequencies used.

Figure 2:
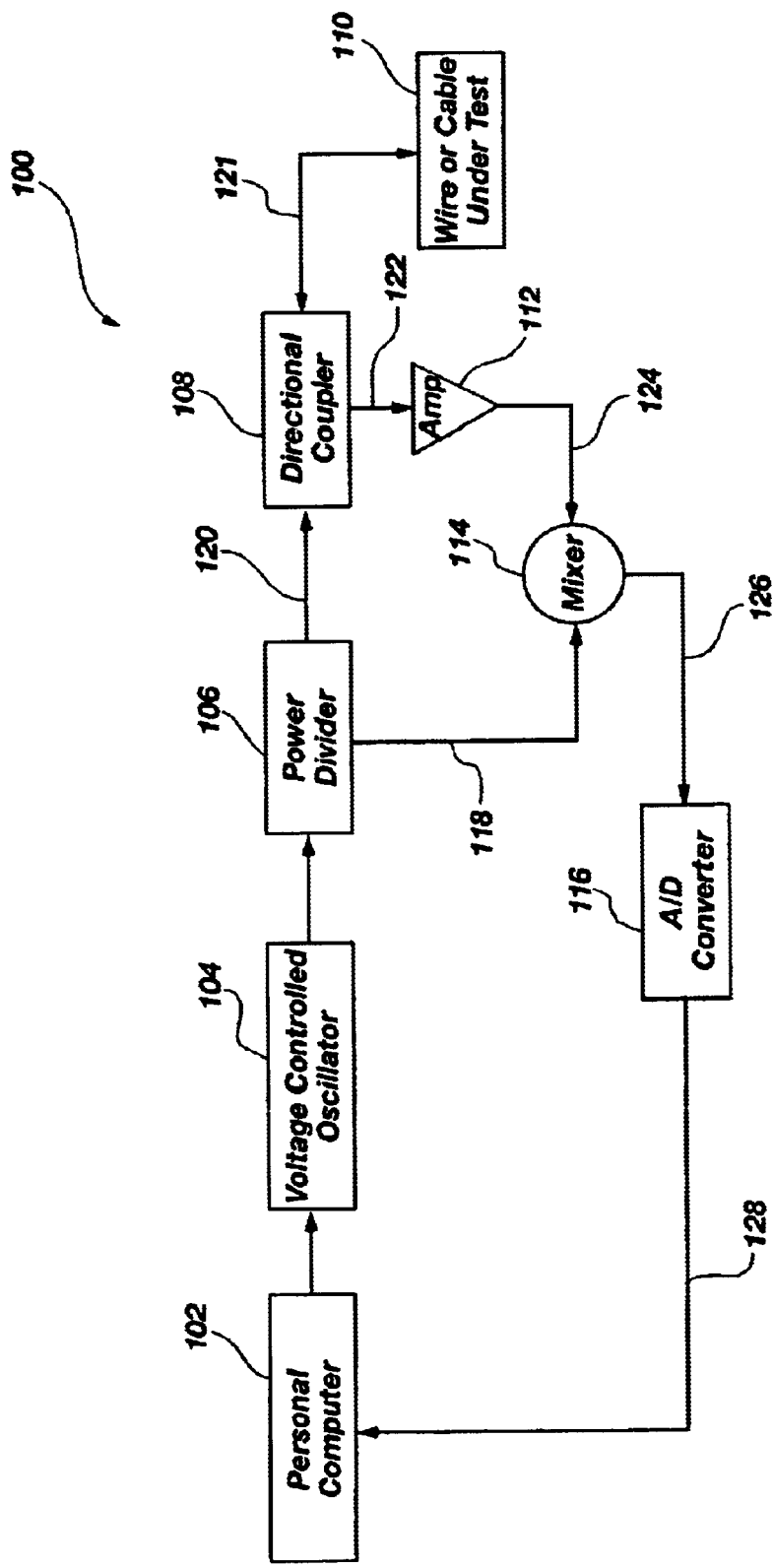
FIG. 2 is an alternative embodiment of the FDR cable testing system in the form of a schematic block diagram.

FIG. 2 is an illustration of FDR cable testing system 100 providing additional detail not shown on the basic circuitry shown in FIG. 1. FIG. 1 shows that a personal computer 102 is performing the functions of controlling the generation of an input signal, as well as the function of calculating the desired information regarding a cable under test. The personal computer 102 is coupled to a sine wave generator such as the voltage-controlled oscillator 104. The VCO 104 receives a control signal in the form of an analog voltage from the personal computer 102, and generates at least one sine wave that is transmitted to the power divider 106 as an input signal. The power divider 106 is this embodiment is a 3 dB power divider. However, a 20 dB power divider or other value could be used. The power divider 106 is configured to split the input signal along two separate transmission paths 118 and 120. A mixer 114 receives the input signal transmitted along transmission path 118. The cable under test 110 receives the input signal transmitted along transmission path 120, through the directional coupler 108 and path 121.

The input signal traveling down the CUT 110 continues until a point of termination of the CUT 110 is reached. Termination of the CUT 110 is generally going to be either an open circuit or a short circuit condition, although less extreme terminations can also be evaluated.

When the input signal encounters a termination of the CUT 110, the input signal is reflected. The reflected input signal is transmitted to a directional coupler 108, and then to an amplifier 112 along transmission path 122. The reflected input signal is amplified in this embodiment so that it approximately matches the magnitude of the input signal that was transmitted to the mixer 114. After the reflected input signal has been amplified, it is also sent to the mixer 114 along transmission path 124.

It should be explained that the amplifier is optional. When the CUT 110 is long, the reflected input signal may be relatively weak when compared to the input signal. Thus, it can be beneficial to amplify it. But amplification may not be necessary.

The mixer 114 receives two signals, the input signal from the VCO 104, and the reflected input signal from the CUT 110, all of which are at the same frequency. A mixer output signal is comprised of three components: the original input signal, the sum of the input signal and the reflected input signal, and the difference between the input signal and the reflected input signal. The mixer output signal is transmitted to an A/D converter 116 along transmission path 126. The A/D converter 116 is effectively a low pass filter. The input signal and the sum of the input signal and the reflected input signal are filtered out. But the difference between the input signal and the reflected input signal is a DC voltage value, which is converted by the A/D converter 116.

After conversion of the analog mixer output signal to a digital signal, the digital signal is sent to the personal computer 102 along transmission path 128. Analysis of the digital signal received by the personal computer 102 is performed to determine a termination point of the CUT 110 in accordance with characteristics of the digital signal.

Figure 3:
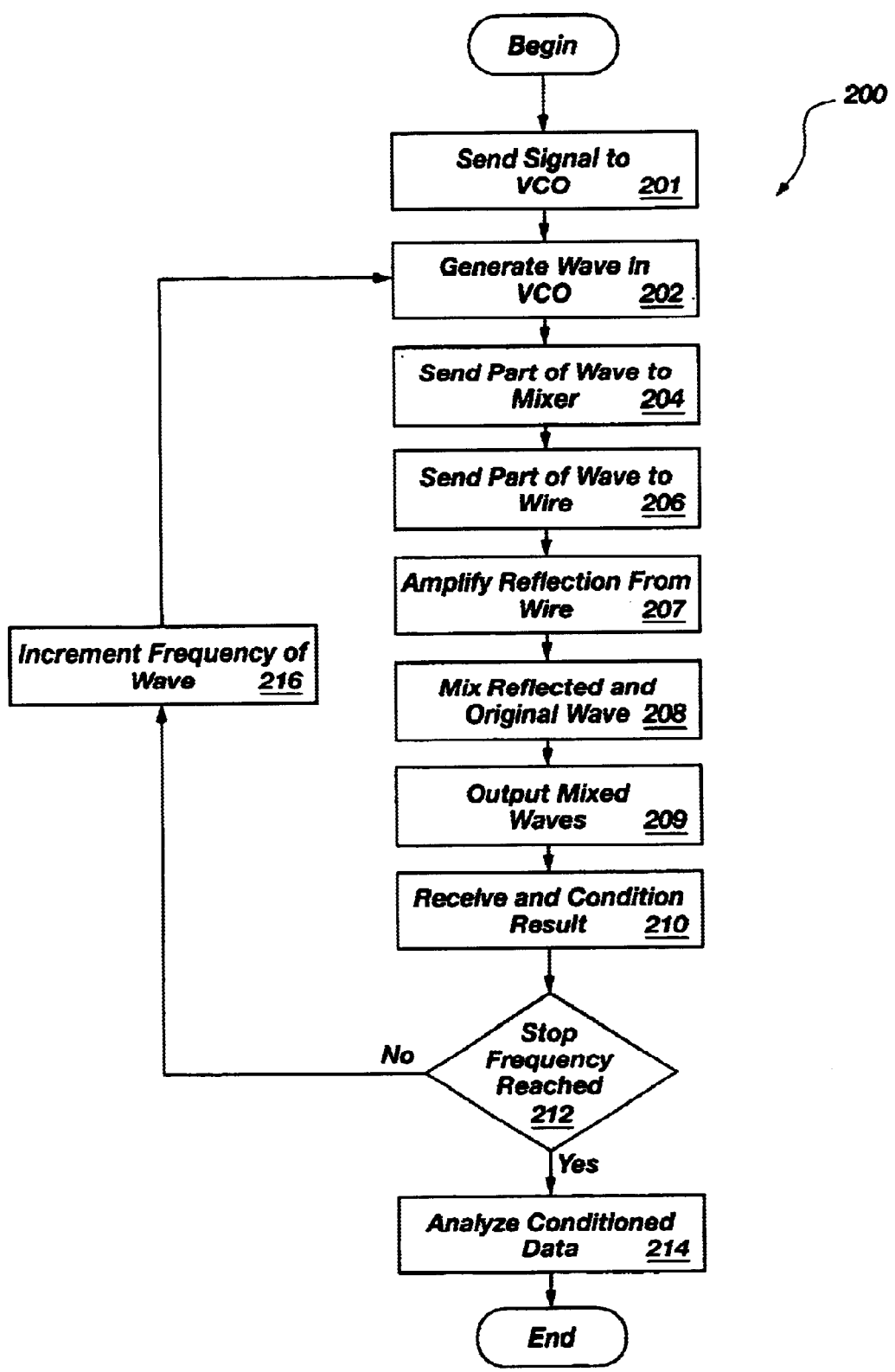
FIG. 3 is a flowchart illustrating one embodiment of a method of utilizing the FDR cable testing system as described in FIG. 1.

FIG. 3 is a flowchart that helps to describe the flow of the process performed by the FDR cable testing system described in FIG. 2. The method 200 begins with step 201 by transmitting a command signal from the personal computer 102 to the VCO 104 indicating the frequency of the sine wave to be generated by the VCO. The command signal transmitted in step 201 is received by the VCO 104 which then generates the sine wave of the required frequency in step 202. A power divider 106 then divides the sine wave generated in step 202 so that it is sent to both the mixer 114 in step 204 and to the CUT 110 in step 206.

The input signal travels down the CUT 110 until it encounters either the open circuit or the short circuit and is reflected from the open or short circuit. The reflected input signal is then amplified by the optional amplifier 112 in step 207 and sent to the mixer 114. In step 208, the mixer 114 combines the original input signal and the reflected input signal. In step 210, the mixed signals are received by the A/D converter 116 and conditioned. The method of FIG. 3 is now interrupted in order to review the conditioning process 210 in more detail in FIG. 4.

Figure 4:
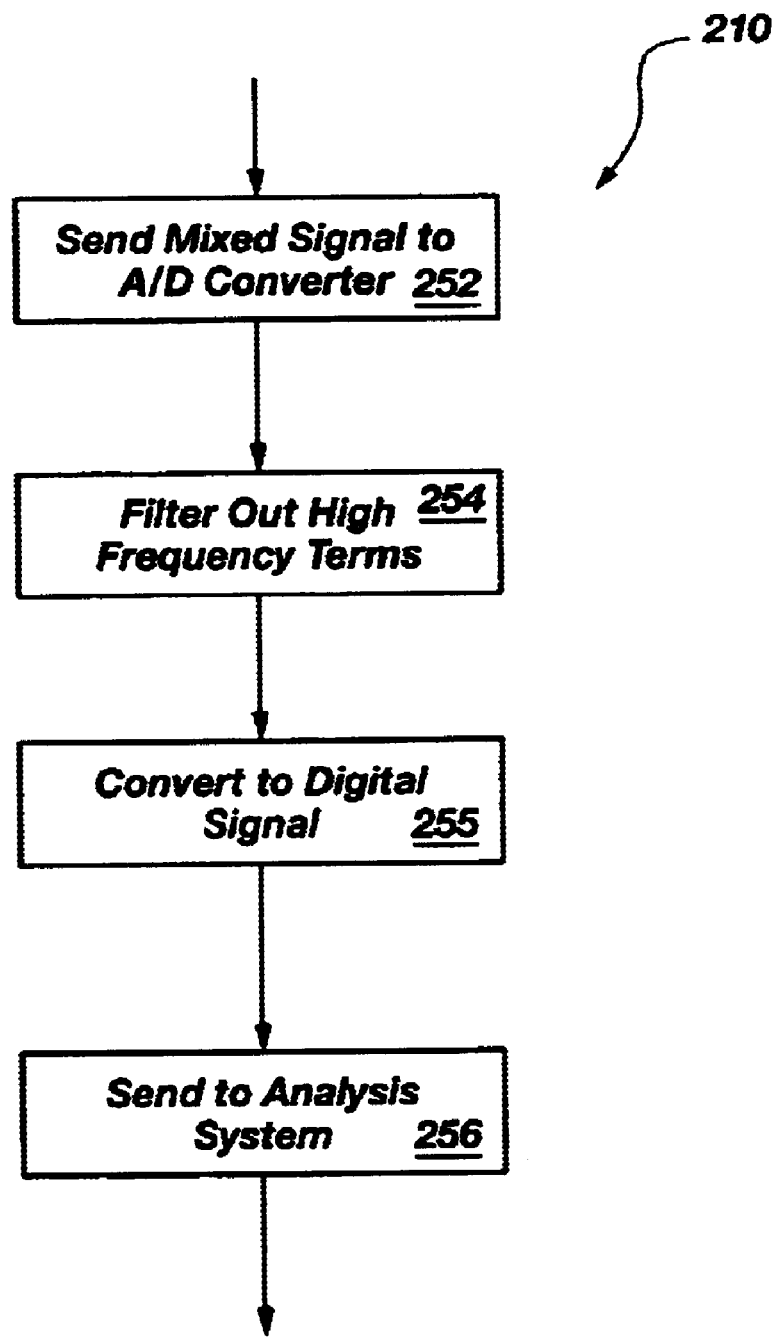
FIG. 4 is flowchart illustrating an embodiment of a method for conditioning a signal received from the FDR cable testing system as described in FIG. 1.

FIG. 4 shows that the output of the mixer 114 is actually three mixed signals. The mixed signals are the original input signal, the sum of the input signal and the reflected input signal, and the difference of the input signal and the reflected input signal. These three mixed signals are sent to the A/D converter 116 in step 252. The A/D converter 116 filters out the high frequency components of the three mixed signals in step 254. The results of this are that the input signal and the sum of the input signal and the reflected input signal are dropped. The remaining DC signal, which is the difference between the input signal and the reflected input signal, is converted to a digital voltage (referred to as a digital signal hereinafter) in step 255. The digital signal is transmitted to the personal computer 102 in step 256.

The digital signal which is the difference between the input signal and the reflected input signal is a DC signal having a voltage that is dependent upon the frequency of the original input signal, the length of the CUT 110, and the point of termination of the CUT 110.

Returning now to FIG. 3, the method 200 next determines if a predetermined stop frequency has been reached in step 214. A stop frequency is whatever frequency that has been determined that the VCO 104 will not go beyond when generating the input signal, or in other words, the frequency of the sine wave. If the predetermined stop frequency has not been reached, the frequency of the sine wave to be transmitted as the new input signal is incremented in step 216, also according to a predetermined step frequency value that is recorded in the personal computer 102. The personal computer 102 sends a new frequency for the input signal to be generated by the VCO 104, and the method 200 begins again at step 202 until the predetermined stop frequency is reached.

In one preferred embodiment, a starting frequency that is transmitted from the personal computer 102 to the VCO 104 is 800 MHz, a stop frequency is 1.2 GHz, and a step frequency, by which the input signal will be incremented through each iterative run through the method 200 until reaching the stop frequency, is 10 MHz. As indicated in step 214, the personal computer analyzes the data to determine characteristics of the CUT 110. The values given above may change so should not be considered limiting, but they are provided as one possible set of frequency values that can work for many cables.

It is noted that other frequency bands have been used, beginning at 200, 300 and 400 MHz. Experimentation is proceeding with 50 MHz frequency bands. Lower frequency bands do provide benefits to the system.

Figure 5:
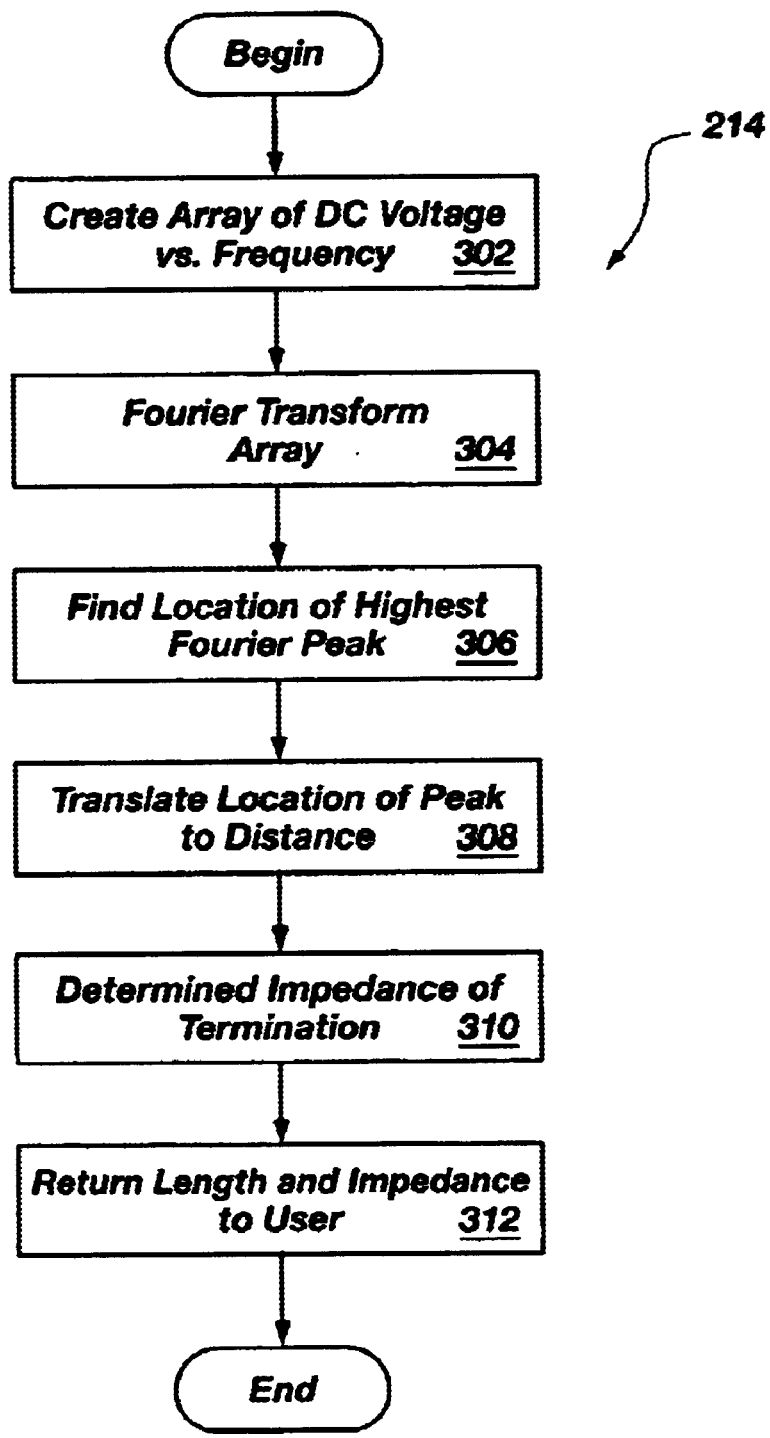
FIG. 5 is a flowchart illustrating an embodiment of a method for processing data received from the FDR cable testing system as described in FIG. 1.

FIG. 5 is a flowchart of a method 300 of analyzing the digital signal received by the personal computer 102 from the A/D converter 116 in FIG. 2. The A/D converter 116 will send a plurality of digital signals to the personal computer 102, one digital signal for each of the frequencies used as input signals by the VCO 104. In step 302, the plurality of digital signals are stored in a memory array in the personal computer 102. Once the FDR cable testing system 100 has completed stepping through a desired range of frequencies, the stored data is processed in step 304.

In one embodiment, the step of processing begins by indexing the array by frequency of the input signal vs. the DC response at that frequency. This indexing creates a table of the DC response of the CUT 110 at all of the stepped input frequencies. The array created in step 302 is then transformed using the Fast Fourier Transform (FFT) by the personal computer 102 in step 304.

The FFT of the array in step 304 creates a Fourier signal having a given magnitude. The location of the peak of the Fourier signal having the greatest magnitude is then determined in step 306. The location of the highest peak is then translated to a distance along the CUT 110 where the point of termination occurred. In so doing, the location of the termination of the CUT 110 is given by equation 1, where L is the length of the cable to the point of termination, u is the velocity of propagation of the wave in the cable, wherein N is the number of cycles of the digital signal as a function of frequency, and $f_{BW}$ is the bandwidth in Hertz of the sampling range.

Equation 1: $L = \dfrac{uN}{2f_{BW}}$

Once the location of the point of termination has been determined in step 308, the nature of the point of termination can be determined in step 310. This is found by determining the impedance of the point of termination. A small impedance indicates a short circuit, while a large impedance indicates an open circuit. In order to calculate impedance at the point of termination, equations 2 and 3 are utilized.

Equation 2: $Z_{in} = Z_0 \dfrac{(p+1)}{(p-1)}$

Equation 3: $Z_L = \dfrac{Z_0(Z_{in} - jZ_0 \tan\beta l)}{(Z_0 - jZ_{in} \tan\beta l)}$ In equations 2 and 3, $Z_{in}$ is the input impedance of the system, p is the complex reflection coefficient of the CUT 110, $Z_0$ is the impedance at the point of termination of the CUT 110, and l is the length of the CUT 110 as found in step 308. By solving equation 2 for $Z_{in}$ and then solving equation 3 for $Z_L$ the impedance of the termination of the CUT 110 may be determined. The length of the CUT 110 and the impedance at the point of termination of the wire are then returned to the user in step 312.

One advantage of the embodiments of the present invention is that the FDR cable testing systems are portable. In other words, the cable testing may be performed using an ordinary laptop or notebook computer as the personal computer 102, and thus taken on-site to conduct cable testing. The flexibility of the system becomes quite clear after realizing that an aircraft does not have to be returned to a hangar, but can be analyzed wherever it is located.

When the personal computer 102 is replaced by a microprocessor, the cable testing system becomes a compact in situ device.

Now that basic FDR is understood, it is a first aspect of the present invention to teach an application of FDR that is highly advantageous over the state of the art in testing of cables. The presently preferred embodiment of the present invention utilizes FDR to satisfy a need in the cable testing industry. What is needed is a system that would enable rapid determination of cable integrity that is less expensive and just as reliable as the state of the art systems presently in use. Specifically, it is the purpose of this document to teach a system wherein FDR provides this capability.

Consider an FDR system that is readily deployable in the testing of aircraft wiring. Turning to the example of an airliner, there are miles of cabling that cannot be visually inspected for damage within the aircraft. Furthermore, removing the cabling for inspection would probably cause more damage than it would cure. The FDR cable testing system of the present invention can be utilized in this situation. It might be assumed that the FDR cable testing system can be coupled to a cable to be tested, and then tested for damage. However, this can be a difficult task, depending upon the specific nature of the damage that may have occurred to the cable. For example, it may be relatively simple to detect a broken cable, or a cable that is shorted to ground, but it may be much more difficult to detect a frayed cable, a broken cable that is not grounded, a cable with cracked insulation, or insulation with pinholes through it.

Accordingly, the present invention readily solves this problem through the use of baselining. Thus, whereas it has not been economically viable to utilize a cable testing to test a large amount of cabling away from a laboratory or away from laboratory conditions, it is now possible to utilize the FDR cable testing system to use baselining to much more easily determine if a cable has experienced some type of damage.

Figure 6:
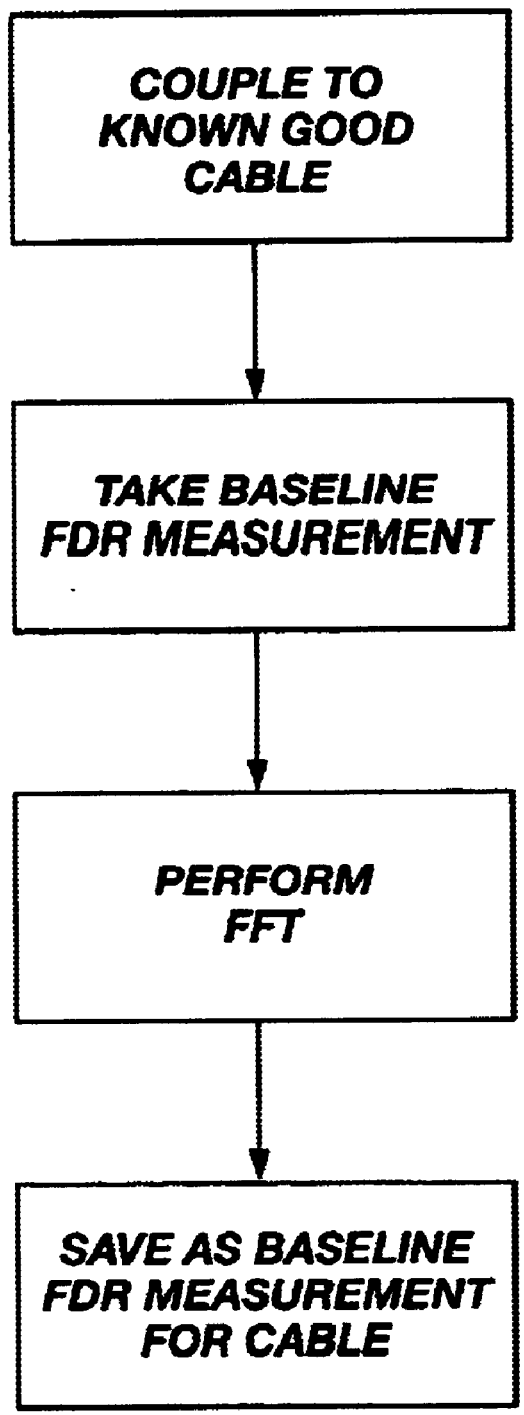
FIG. 6 is a flowchart of the method used to obtain baseline FDR measurements for a cable.

In FIG. 6, the first step is that the FDR cable testing system of the present invention is first coupled to a cable. For this method to work, it is important that the cabling be known to be in good or operating condition. The next step is for the FDR cable testing system to be utilized to take measurements or readings. These measurements are those that would be taken in order to determine the characteristics of a cable, including such things as length, impedance (which is characterized as an open or short circuit condition), the location of an open or short circuit, capacitance, inductance, and resistance. It should be remembered that it is not necessary that the FDR measurement actually be used to determine these characteristics. It is only important that the measurements be taken and recorded so that they can be compared to another measurement taken at a later time. Thus, the only processing of the data is to perform Fast Fourier Transforms. The FDR measurement process is repeated for all the cables that need to be verified for integrity. These measurements form the baseline of the tested cables. Each cable will have its own FDR measurement characteristics that are likely to be unique.

It is not important to determine exactly what the baseline FDR measurements indicate because they are assumed to be made on cables whose integrity has not been compromised. What is important is that baseline FDR measurements have been made, with each FDR measurement being associated with a specific cable. These baseline FDR measurements are typically going to be saved in a database that is readable by computer, and stored in any appropriate computer readable medium, such as on a hard disk or other long term storage device, such as a CD-R, CD-RW, or tape backup.

Figure 7:
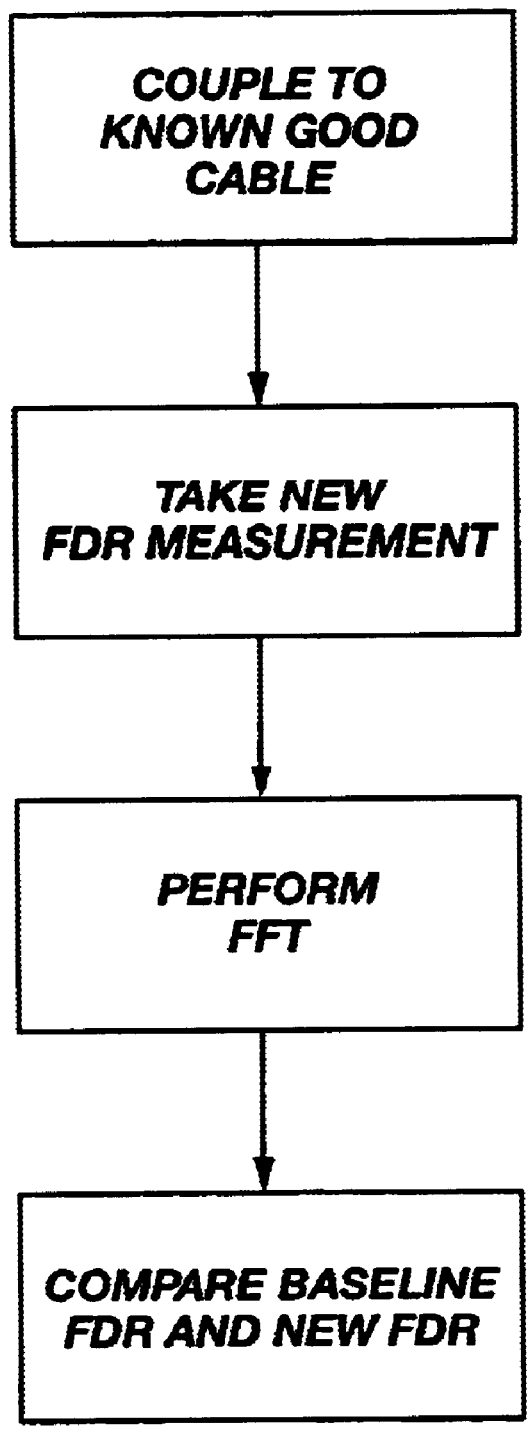
FIG. 7 is a flowchart of the method used to obtain new FDR measurements, and perform a comparison with the baseline to determine if the integrity of the cable is in question.

In FIG. 7, the method outlined for using the baseline FDR measurements assumes that some period of time has elapsed since the baseline FDR measurements were taken. The first step is to take a new FDR measurement of a cable to be tested. After taking this new FDR measurement, and performing the FFT calculations, the corresponding baseline FDR measurement for the cable under test is retrieved from the memory that was used to store the baseline FDR measurements in FIG. 6. The next step is to perform a comparison of the baseline FDR measurement with the new FDR measurement. This comparison can be performed in several ways.

Figure 8:
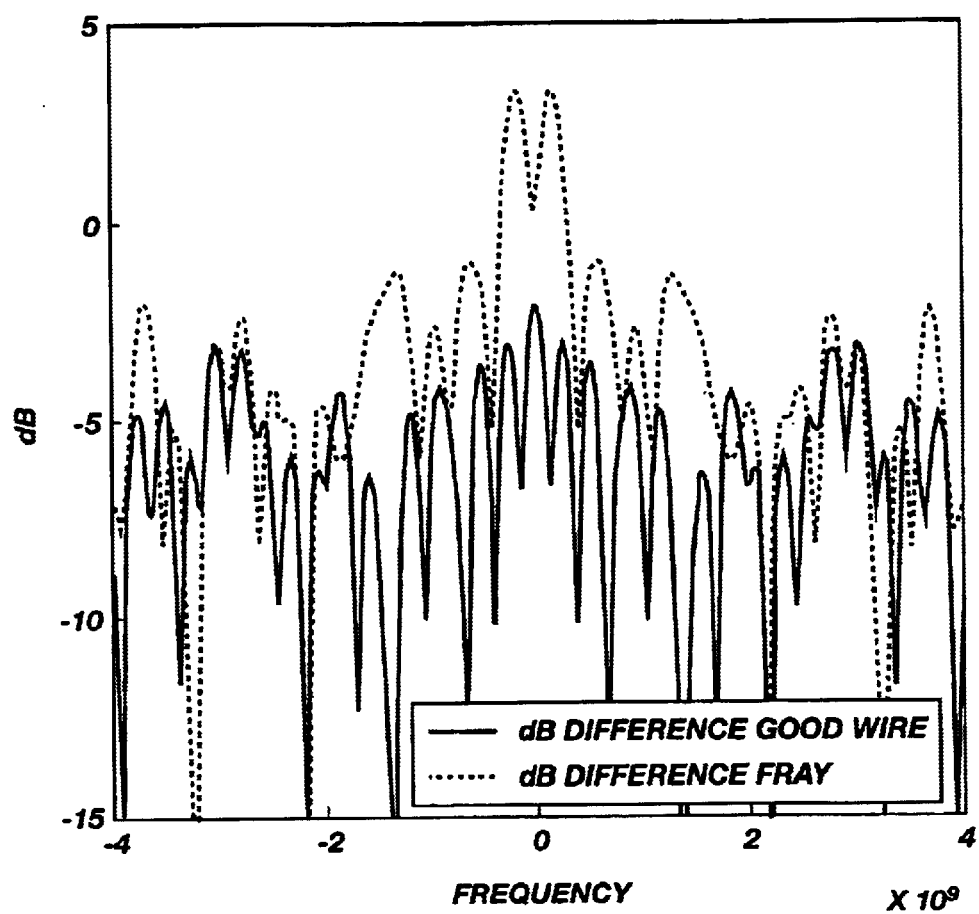
FIG. 8 is a graphical illustration of a baseline FDR measurement waveform superimposed on a new FDR measurement waveform.

FIG. 8 illustrates that a relatively simple method is to display the FDR measurements in a graphical format, superimposed upon each other. In other words, waveforms are generated from the Fast Fourier Transforms that are obtained in the FDR measurements. In this way, an observer can quickly and easily look at waveforms to determine if any change has occurred. The rule to apply when using the method of the present invention is that any change in the waveforms from the FDR measurements can be considered to be an indication that the integrity of the cable under test has in some way been compromised. In other words, any change is assumed to be a bad change, and the cable under test must undergo detailed examination, or simply be replaced.

It should be understood that there are other methods of performing the comparison of a baseline FDR measurement and a new FDR measurement. These methods include a computer analysis that compares various data points along the waveforms generated by the Fast Fourier Transforms.

Figure 9:
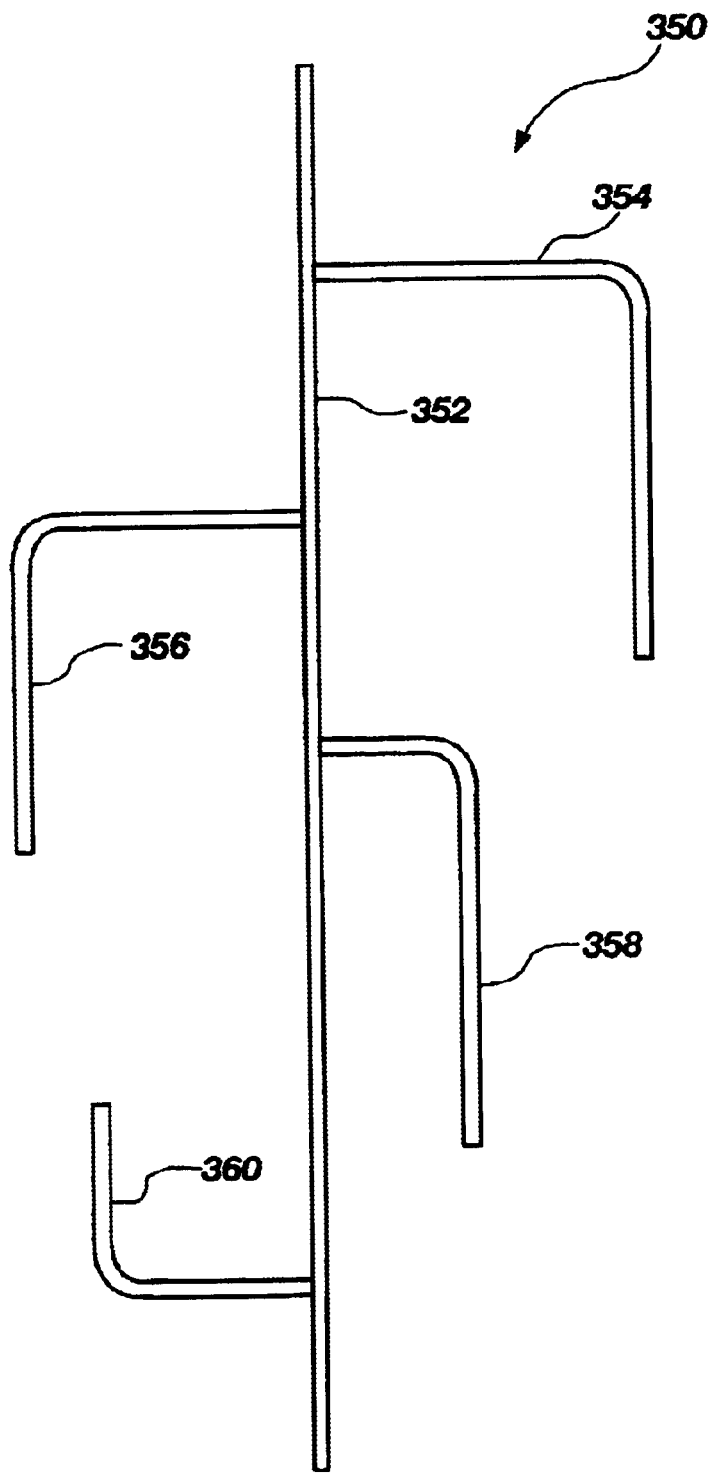
FIG. 9 is an illustration of a cable tree having a plurality of cables branching off a main cable trunk.

The present invention is also capable of performing tasks other than FDR cable testing and baselining. The next aspect of the present invention is the function of mapping as shown in FIG. 9. FIG. 9 shows a cable tree 350 having a plurality of cables 354, 356, 358, 360 that branch out from a main cable trunk 352 at various places. It is possible to determine the length of the branches 354, 356, 358, 360, and where the cable branches are located along the main cable trunk 352. No significance should be attached to the shape of the cables shown in the figure.

It is generally going to be the case that the configuration of a single cable, a cable tree, or a cable network is going to be understood, and thus FDR will be used to determine cable integrity. However, there are some circumstances under which a single cable, a cable tree or cable network may undergo changes, and it may be desirable to construct a map of the cabling.

Creating a map of cabling utilizing an FDR cable testing system is achieved by utilizing the system to identify the location of connecting cables, and the lengths of the connected cables. This might be useful, for example, to a cable television utility. The present invention can be used to determine if the correct number of splices into a television cable have been made. If the number is greater than the known number of connections, the present invention can then be used to pinpoint where the unauthorized connection or connections are being made. It is then a simple matter to follow the unauthorized connection or connections to their sources and remove them.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A method for creating Baseline FDR measurements to be used for determining integrity of a cable under test utilizing a frequency domain reflectometry (FDR) cable testing system, said method comprising the steps of:

(1) coupling the FDR cable testing system to a connecting end of the cable under test, wherein it is assumed that the integrity of the cable under test is not compromised;

(2) generating signals from the FDR cable testing system in order to obtain a baseline FDR measurement for the cable under test, comprising the steps of:

(a) transmitting at least one input signal from the FDR cable testing system to the cable under test, and to a mixer;

(b) receiving a reflected input signal from the cable under test;

(c) mixing the at least one input signal and the reflected input signal in the mixer to thereby generate a DC signal; and (3) storing the baseline FDR measurement for the cable under test.

2. The method as defined in claim 1 wherein the method further comprises the steps of:

(1) coupling the FDR cable testing system to the connecting end of the cable under test after obtaining the baseline FDR measurement for the cable under test;

(2) obtaining a new FDR measurement for the cable under test by generating signals from the FDR cable testing system;

(3) comparing the baseline FDR measurement against the new FDR measurement to thereby determine if there has been a detectable change in FDR measurements of the cable under test; and (4) determining that the integrity of the cable under test may be compromised if there is a detectable change in FDR measurements, and determining that the integrity of the cable under test is not compromised if there is no detectable change in FDR measurements.

3. The method as defined in claim 2 wherein the step of storing the baseline measurement further comprises the step of storing the baseline measurement in a computer readable storage medium.

4. The method as defined in claim 3 wherein the steps of obtaining the baseline FDR measurement and the new FDR measurement further comprises the steps of:

(1) generating a first waveform representing the baseline FDR measurement; and (2) generating a second waveform representing the new FDR measurement.

5. The method as defined in claim 3 wherein the step of comparing the baseline FDR measurement against the new FDR measurement further comprises the steps of:

(1) overlapping the first waveform representing the baseline FDR measurement over the second waveform representing the new FDR measurement; and (2) making a visual comparison of the first waveform and the second waveform to determine if they appear identical.

6. The method as defined in claim 5 wherein the step of comparing the baseline FDR measurement against the new FDR measurement further comprises the step of performing a comparison of a first waveform representing the baseline FDR measurement against a second waveform representing the new FDR measurement by utilizing a computer algorithm to make the comparison.

7. The method as defined in claim 6 wherein the method further comprises the steps of:

(1) obtaining a plurality of baseline FDR measurements for a plurality of cables under test; and (2) storing the plurality of baseline FDR measurements for the plurality of cables under test in a database, wherein each of the plurality of cables under test has associated therewith a corresponding one of the plurality of baseline FDR measurements.

8. The method as defined in claim 7 wherein the method further comprises the step of determining integrity of the cable under test only by making a comparison of the baseline FDR measurement and the new FDR measurement, and without having to interpret the baseline FDR measurement or the new FDR measurement.

9. The method as defined in claim 8 wherein the step of generating signals from the FDR cable testing system in order to obtain the baseline FDR measurement for the cable under test further comprises the steps of:

(1) transmitting at least one input signal from the FDR cable testing system to the cable under test;

(2) receiving a reflected input signal from the cable under test;

(3) mixing the at least one input signal and the reflected input signal to generate a DC signal; and (4) processing the DC signal to thereby obtain data that is represented by the first waveform of the cable under test.

10. The method as defined in claim 9 wherein the step of generating signals from the FDR cable testing system in order to obtain the new FDR measurement for the cable under test further comprises the steps of:

(1) transmitting at least one input signal from the FDR cable testing system to the cable under test;

(2) receiving a reflected input signal from the cable under test;

(3) mixing the at least one input signal and the reflected input signal to generate a DC signal; and (4) processing the DC signal to thereby obtain data that is represented by the second waveform of the cable under test.

11. The method as defined in claim 10 wherein the method further comprises the steps of:

(1) generating a sum of the at least one input signal and the reflected input signal;

(2) generating the difference of the at least one input signal and the reflected input signal; and (3) generating the at least one input signal, wherein the three components form the mixed signal.

12. The method as defined in claim 11 wherein the method further comprises the step of filtering out high frequency components from the mixed signal.

13. The method as defined in claim 12 wherein the method further comprises the steps of:

(1) dropping the sum of the at least one input signal and the reflected input signal;

(2) dropping the at least one input signal; and (3) converting the difference of the at least one input signal and the reflected input signal which is an analog direct current (DC) voltage signal to a digital signal.

14. The method as defined in claim 13 wherein the method further comprises the steps of:

(1) generating a plurality of input signals, wherein the plurality of input signals are utilized to generate a plurality of digital signals;

(2) storing the plurality of digital signals in an array, wherein a frequency of each of the plurality of input signals is associated with a corresponding digital signal that is generated thereby; and (3) performing a Fast Fourier Transform (FFT) on each of the plurality of digital signals to thereby generate a plurality of Fourier signals, one for each of the plurality of digital signals, and wherein each of the plurality of Fourier signals has a given magnitude.

15. The method as defined in claim 14 wherein the step of transmitting the at least one input signal from the FDR cable testing system to the cable under test further comprises the steps of:

(1) providing a personal computer, wherein the personal computer generates a command signal containing a predetermined frequency for a sine wave; and (2) providing a voltage controlled oscillator (VCO), wherein the VCO receives the command signal and generates the sine wave of the predetermined frequency value to thereby produce the input signal.

16. The method as defined in claim 15 wherein the method further comprises the steps of:

(1) providing a power divider, wherein the power divider splits the input signal;

(2) providing a mixer, wherein the mixer receives the input signal that is split by the power divider; and (3) providing the cable under test, wherein the cable under test also receives the input signal that is split by the power divider.

17. The method as defined in claim 16 wherein the method further comprises the steps of:
- (1) transmitting the reflected input signal from the point of termination of the cable under test to a directional coupler;
- (2) transmitting the reflected input signal from the directional coupler to an amplifier; and
- (3) amplifying the reflected input signal to thereby have a magnitude that is approximately the same as the input signal that was transmitted to the mixer.

18. The method as defined in claim 17 wherein the method further comprises the steps of:
- (1) mixing the input signal received from the power divider and the reflected and amplified input signal received from the amplifier; and
- (2) generating the mixed signal as defined in claim 11.

19. The method as defined in claim 18 wherein the method further comprises the steps of:
- (1) filtering high frequency components from the mixed signal;
- (2) digitizing the analog mixed signal; and
- (3) transmitting the digitized signal to the personal computer for storage in the array of claim 14.

20. The method as defined in claim 19 wherein the method further comprises the steps of:
- (1) generating the command signal that contains the first frequency for the VCO to generate;
- (2) receiving the digital signal from the A/D converter;
- (3) adding a stepped input frequency to a previous frequency transmitted to the VCO to generate a new frequency for the VCO to generate;
- (4) transmitting the new frequency to the VCO in a new command signal; and
- (5) repeating steps (2) through (4) until the new frequency is equal to or greater than a predetermined stop frequency.

21. The method as defined in claim 20 wherein the step of performing a transformation further comprises selecting the transformation from the group of transformations comprised of Discrete Fourier Transform, Two Equations—Two Unknowns method, N-Equations N-Unknowns, Interpolation and FFT, Interspersing Zero Points and Low Pass Filtering, Acceleration of Data Signal, Zero Crossing of Signals, and Mathematical Modeling.

22. A cable testing system that utilizes principles of frequency domain reflectometry (FDR) to thereby determine characteristics of a cable under test (CUT) that can be used to determine changes in the CUT, said cable testing system comprising:
- a voltage controlled oscillator (VCO) for generating an input signal;
- a power divider for receiving the input signal from the VCO and dividing the input signal into at least two signals;
- a mixer for receiving the divided input signal from the power divider;
- wherein the CUT also receives the divided input signal from the power divider, and generates a reflected input signal, and wherein the mixer receives the divided input signal from the power divider and the reflected input signal from the CUT to thereby generate a mixed signal having at least two components;
- an analog to digital (A/D) converter for receiving the mixed signal and filtering out high frequency components therefrom, and for generating a digital signal, wherein the digital signal contains a signal that is dependent upon a frequency of the input signal, a length of the CUT, and of a point of termination of the CUT; and
- a processor for utilizing the digital signal to thereby generate a baseline FDR measurement if the CUT is being measured a first time, or to generate a new FDR measurement if the CUT is being tested against a previously obtained baseline FDR measurement.

23. The cable testing system as defined in claim 22 wherein the cable testing system further comprises a computer, wherein the computer controls the VCO and performs calculations to thereby determine the characteristics of the cable under test.

24. The cable testing system as defined in claim 23 wherein the cable testing system further comprises:
- a directional coupler for receiving the reflected input signal from the CUT; and
- an amplifier for receiving the reflected input signal from the directional coupler and amplifying the reflected input signal, wherein the amplifier transmits the reflected input signal to the mixer.

25. A method for determining characteristics of a cable under test utilizing a cable testing system that uses principles of frequency domain reflectometry (FDR), said method comprising the steps of:
- (1) providing a signal generator for generating a sine wave, a power divider coupled to the signal generator at an input, and to a mixer and the cable under test at two outputs, wherein the mixer is also coupled at another input to the cable under test (CUT) for receiving a reflected sine wave therefrom, and at an output to an input of an analog to digital (A/D) converter, wherein the A/D converter is coupled at an output to a processor;
- (2) transmitting a sine wave from the signal generator to the cable under test and to the mixer via the power divider;
- (3) receiving a reflected sine wave from the cable under test at the mixer;
- (4) mixing the sine wave and the reflected sine wave to generate a DC signal from the mixer;
- (5) processing the DC signal to thereby obtain data regarding impedance and length of the cable under test;
- (6) changing a frequency of the sine wave;
- (7) performing steps (2) through (6) a predetermined number of times to thereby generated a plurality of DC signals; and
- (8) generating a baseline FDR measurement if the CUT is being measured a first time, or generating a new FDR measurement if the CUT is being tested against a previously obtained baseline FDR measurement.

26. The method as defined in claim 25 wherein the method further comprises the step of mixing the sine wave and the reflected sine wave to thereby generate a mixed signal having at least two components.

27. The method as defined in claim 26 wherein the method further comprises the steps of:
- (1) generating the sum of the sine wave and the reflected sine wave;
- (2) generating the difference of the sine wave and the reflected sine wave; and
- (3) generating the sine wave, wherein the sum, different and original sine wave for three components of the mixed signal.

28. The method as defined in claim 27 wherein the method further comprises the step of filtering out high frequency components from the mixed signal.

29. The method as defined in claim 28 wherein the method further comprises the steps of:

(1) dropping the sum of the sine wave and the reflected sine wave;

(2) dropping the at least one input signal; and (3) converting the difference of the sine wave and the reflected sine wave, which is an analog direct current (DC) voltage signal, to a digital signal, wherein a plurality of digital signals are generated by the plurality of sine waves.

30. The method as defined in claim 29 wherein the method further comprises the steps of:

(1) storing the plurality of digital signals in an array, wherein a frequency of each of the plurality of sine waves is associated with a corresponding digital signal that is generated thereby; and (2) performing a Fast Fourier Transform (FFT) on each of the plurality of digital signals to thereby generate a plurality of Fourier signals, one for each of the plurality of digital signals, and wherein each of the plurality of Fourier signals has a given magnitude.

31. The method as defined in claim 30 wherein the method further comprises the steps of:

(1) providing a personal computer, wherein the personal computer generates a command signal containing a predetermined frequency for the sine wave; and (2) providing a voltage controlled oscillator (VCO) as the signal generator, wherein the VCO receives the command signal and generates the sine wave of the predetermined frequency value.

32. The method as defined in claim 31 wherein the method further comprises the step of utilizing the personal computer to analyze the array after no more sine waves are being generated in order to compare the baseline FDR measurement and the new FDR measurement to thereby determine if there has been a change in integrity of the CUT.

* * * * *